United States Patent [19]

Aubuchon

[11] Patent Number: 4,595,913
[45] Date of Patent: Jun. 17, 1986

[54] CAPACITOR TOUCH ACTIVATED SWITCHING SYSTEM

[75] Inventor: Vaughn F. Aubuchon, Sunnyvale, Calif.

[73] Assignee: Pie Associates, Los Gatos, Calif.

[21] Appl. No.: 465,601

[22] Filed: Feb. 10, 1983

[51] Int. Cl.⁴ .............................................. G06F 3/02
[52] U.S. Cl. ......................... 340/365 C; 200/DIG. 1; 307/116; 340/365 S
[58] Field of Search ............ 340/365 C, 365 S, 365 E, 340/712; 200/DIG. 1; 307/116; 400/479.1

[56] References Cited

U.S. PATENT DOCUMENTS

| | | | |
|---|---|---|---|
| 3,659,285 | 4/1972 | Baer | 273/85 |
| 3,931,610 | 1/1976 | Marin | 340/365 C |
| 3,993,154 | 11/1976 | Simmons | 200/DIG. 1 |
| 4,055,735 | 10/1977 | Eachus | 340/365 C |
| 4,056,699 | 11/1977 | Jordan | 200/DIG. 1 |
| 4,103,252 | 7/1978 | Bobick | 340/365 R |
| 4,177,421 | 12/1979 | Thornburg | 200/DIG. 1 |
| 4,305,007 | 12/1981 | Hughes | 200/DIG. 1 |
| 4,305,135 | 12/1981 | Dahl | 340/365 C |
| 4,363,029 | 12/1982 | Piliavin | 340/365 C |
| 4,494,110 | 1/1985 | Wakeling | 340/365 S |

OTHER PUBLICATIONS

*IBM Technical Disclosure Bulletin*, Williams, vol. 17, No. 1, Jun. 1974, pp. 166-167.

Primary Examiner—James J. Groody
Attorney, Agent, or Firm—Gerald L. Moore

[57] ABSTRACT

A touch sensitive system comprising a clock (30) for generating a clocking signal supplied to a plurality of circuits each including one of the touch plates (12, 14, 15, 16, 17) for generating a varying capacitance value depending upon whether or not the plate is touched or untouched. The change in capacitance of each circuit varies the time duration of the generated output signal of that circuit. A flipflop (18, 19, 20, 21, 22) for each circuit receives a reference signal from a reference circuit (61) and the output signal from the associated circuit and supplies to an associated output terminal (24, 25, 26, 27, 28) a digital signal indicating which plate or plates are touched.

2 Claims, 6 Drawing Figures

CAPACITOR TOUCH ACTIVATED SWITCHING SYSTEM

FIELD OF THE INVENTION

This invention relates to a touch activated transducer, and more particularly to a control system which senses a change in capacitance for the generation of a logical "" or logical "0" output signal, which capacitance change results when a plate connected in the control system is touched.

BACKGROUND OF THE INVENTION

Many systems such a video games, microwave ovens, telephones and the like incorporate control panels which are hand operated. In some instances, video games utilize a lever, known as a "joystick", to move or guide images displayed on a screen. In other instances, devices such as the microwave oven must be preset to determine cooking times and temperatures as well as other functions.

Various types of controls have been utilized to permit regulation of these types of devices. For instance, with video games, the joysticks comprise a vertically extending rod which can be moved in various directions to cause a like movement of an image on the video screen. In the instance of microwave ovens, various heat sensitive, capacitance or pressure sensitive switches are provided for touching to indicate the functions desired. The pressure sensitive switches require a certain force to be exerted before they are operated. Additionally, they require the mechanical movement of at least some component which movement can lead to failure.

Temperature sensitive switches are frequently slower to react because of the necessity to detect a temperature change. Capacitive activated switches, on the other hand, do not require the physical movement of any part and therefore are more mechanically reliable. However, some capacitive switch systems require rather elaborate circuitry to detect the presence of the operator's finger on or adjacent to the touch plate and sometimes are slow to react. One type of capacitive touch activated switch is shown in U.S. Pat. No. 4,103,252, Capacitive Touch-Activated Transducer System Including a Plurality of Oscillators, issued on July 25, 1978. In this system a plurality of oscillators are utilized with the frequency of the oscillator associated with a touch plate that is touched, being changed and detected. In this system the oscillators exhibit some inertia and resist change and also the oscillators must be permitted to cycle several times before an accurate measurement can be made.

It is the purpose of the present invention to provide an improved touch sensitive system utilizing capacitive type plates which are touched to cause a circuit to generate output signals responsive to that touch.

SUMMARY OF THE INVENTION

A touch sensitive system comprising a clock generating a clock signal supplied to a first circuit. The first circuit includes a touch plate generating a varying capacitance value depending upon whether or not the plate is touched or untouched and, responsive to the capacitive value, generating an output signal having a time duration of a first time range if untouched and a second time range period if touched. Means are provided for comparing the output signal received from the first circuit and the signal received from a reference circuit to determine whether the time period of the first circuit signal is in the first or second time range for generating an output signal indicating whether or not the signal is of the first or second time duration and thereby indicate whether the plate is touched or untouched.

DESCRIPTION OF THE INVENTION

Figure 1:
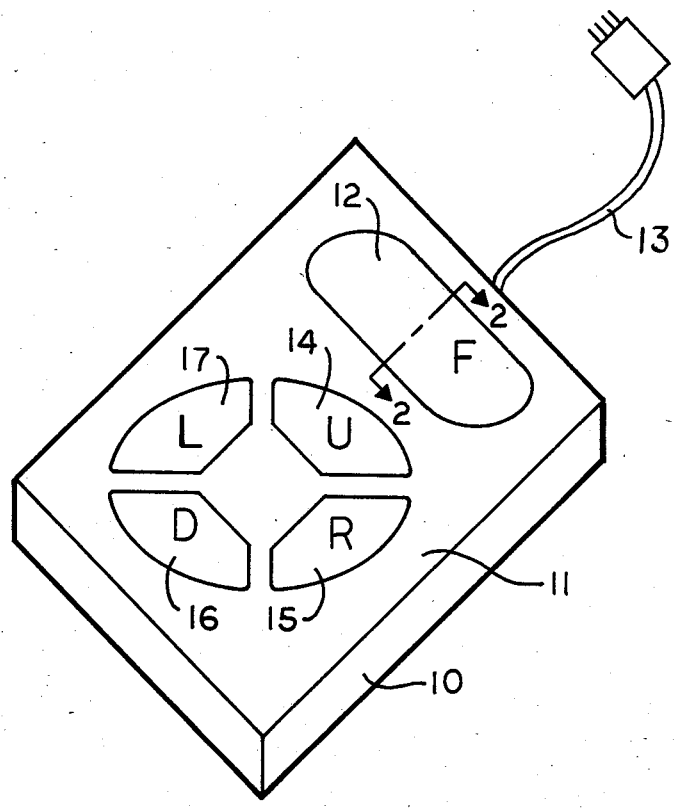
FIG. 1 is a perspective view of a control device for use with the subject invention.

In FIG. 1 is shown a typical control panel suitable for use with the present invention. A base 10, preferably of a size satisfactory to hold in one hand or to mount on a panel, includes a top surface 11 on which are mounted touch plates 12, 14, 15, 16 and 17. The plates are conductive and as the finger is moved from one plate to another the object of the system is to signal or indicate such movement of the finger to a receiving system. In the present embodiment, the receiving system is preferably a video game (not shown) connected to the conductor 13 such that with the directional finger movement indicates the direction of pointing or movement of a selected image on the video screen and the touching of the F plate 12 indicating "firing" as is frequently done in the space war type of game.

Figure 2:
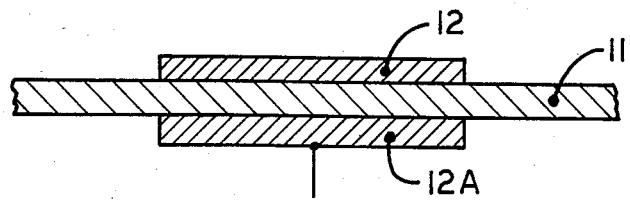
FIG. 2 is a cross sectional view along the line 2—2 of FIG. 1.
Figure 4:
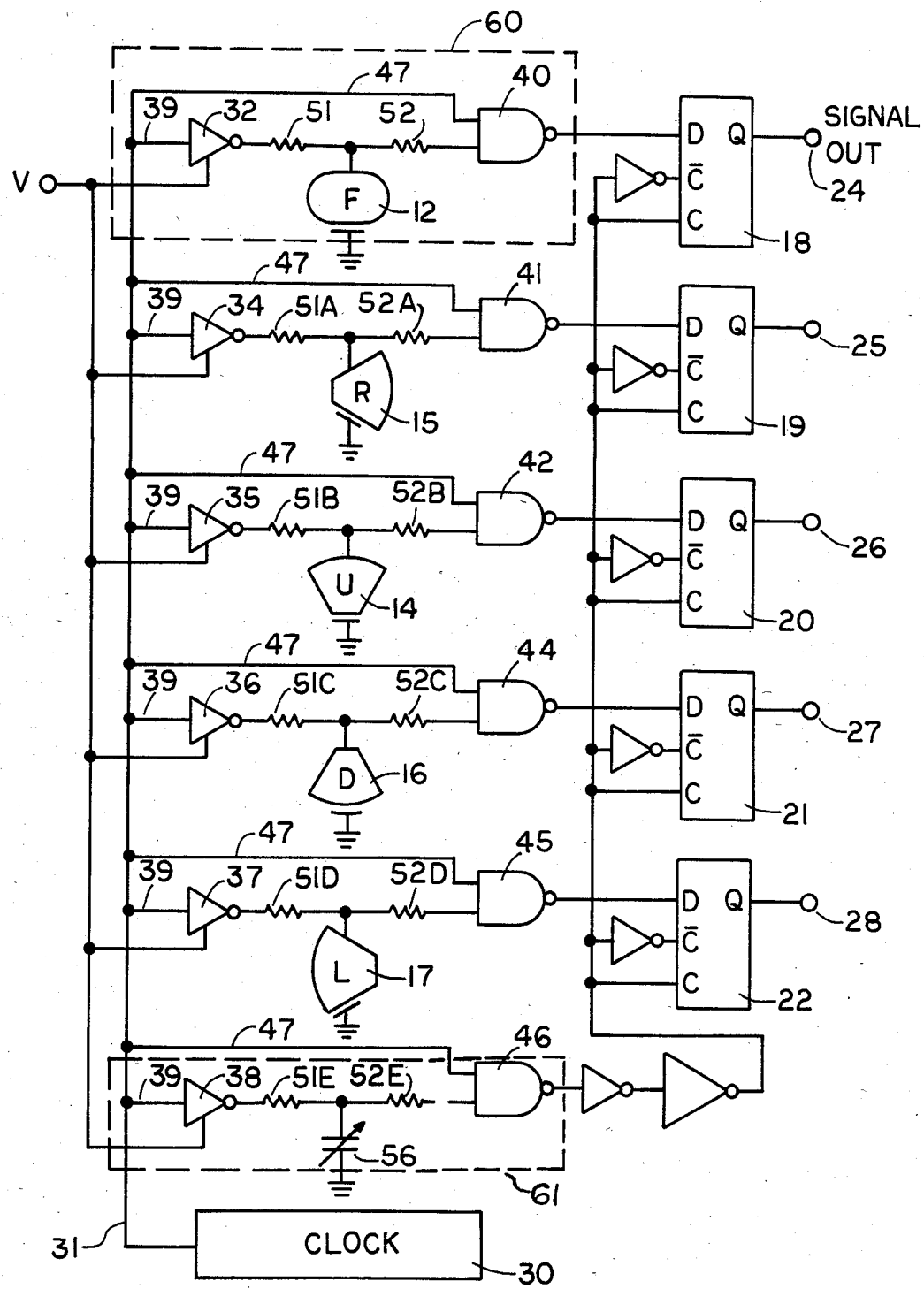
FIG. 4 is a circuit diagram of a control system utilizing the subject invention.

To sense movement of the finger, the circuit of FIG. 4 is provided. This circuit shows the touch plates 12, 14, 15, 16 and 17 connected with the circuit. Each plate is fixed to the dielectric surface 11 and includes a companion plate such as plate 12A (FIG. 2). Each of these circuits is connected through a flip flop 18, 19, 20, 21 and 22 to a terminal 24, 25, 26, 27 or 28, respectively to provide a logical "1" or a logical "0" output signal for transmittal to a subsequent circuit (not shown) acting responsive thereto.

Figure 6:
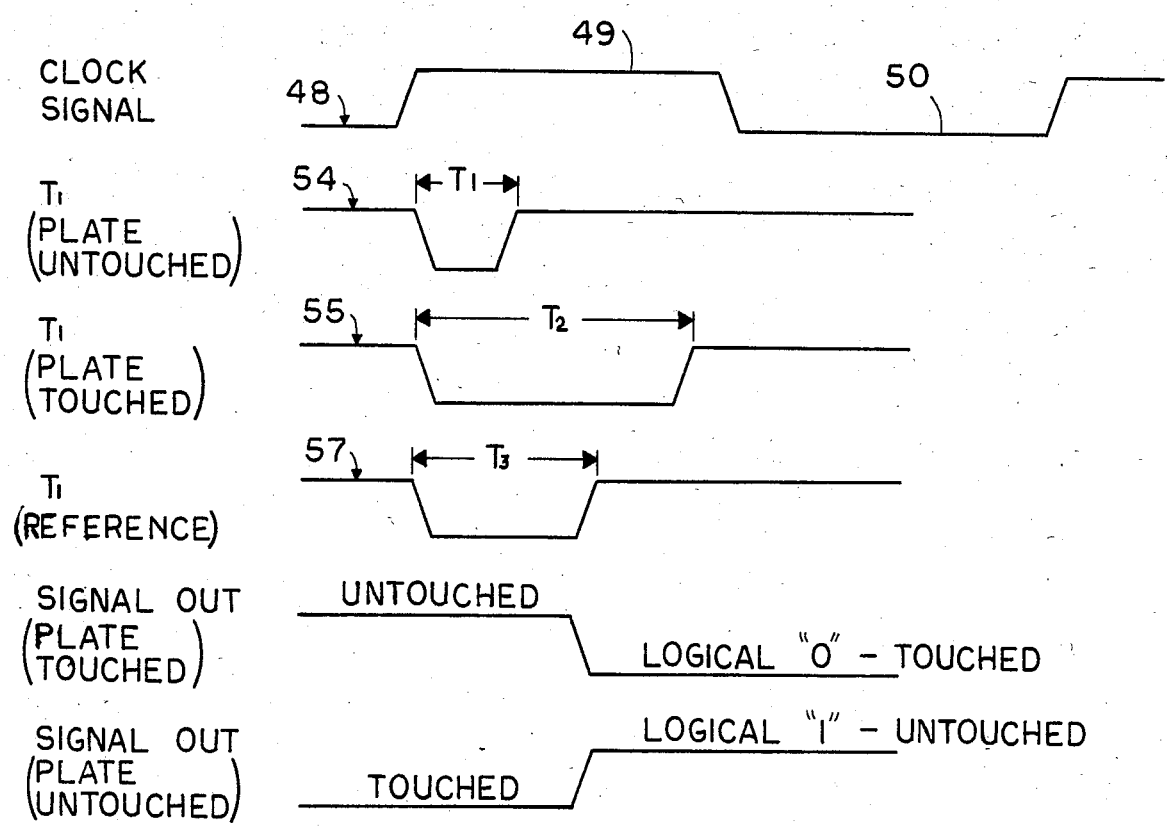

To explain the control shown in FIG. 4, a clock 30 supplies through the conductor 31 a clocking signal to each slow invertor 32, 34, 35, 36, 37 and 38 and to each NAND gate 40, 41, 42, 44, 45 and 46. The clocking signal received appears as shown by the wave form 48 in FIG. 6 wherein the signal cycles from a level 49 to a level 50 alternately. The slow inverter 32 receives the clocking pulse, inverts the signal and transmits it to an RC network comprising the resistors 51 and 52 and the capacitance comprising the touchplate 12. With the plate untouched, the pulse is transmitted through this network and appears as the wave form 54 (FIG. 6). Thus the duration T1 indicates that the plate is not touched, due to the fact that the capacitance of the circuit is lower, and therefore, the RC constant is less, thereby imparting less time delay on the clocking pulse. With the plate 12 being touched, the output signal from the RC circuit appears as the wave form 55, resulting because the RC of the circuit is now higher, since the capacitance is greater due to the touching of the plate 12.

Figure 5:
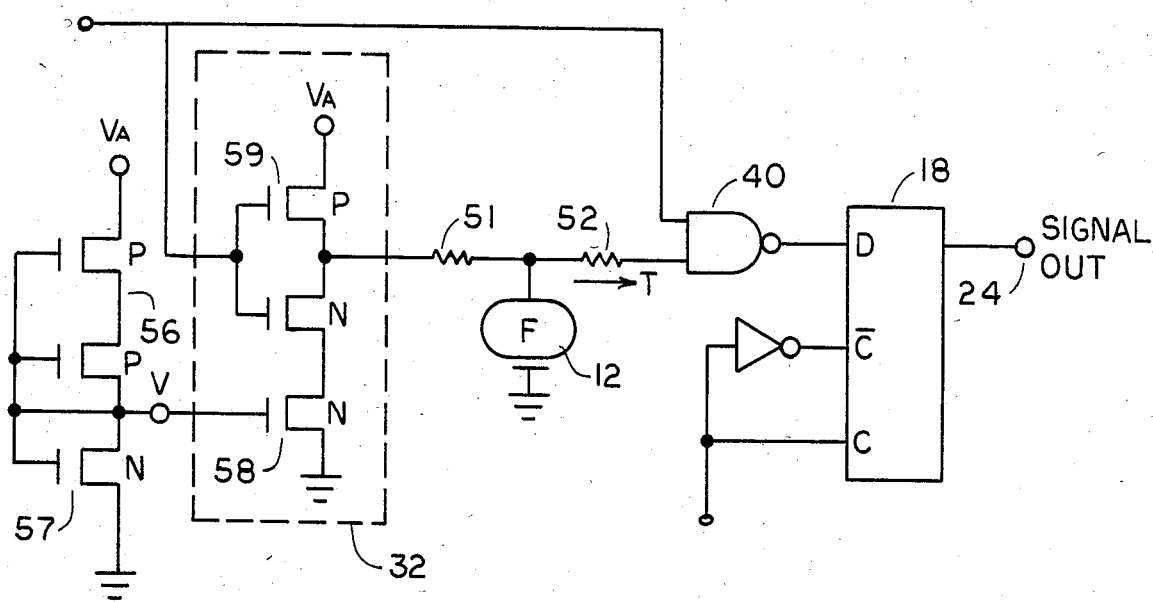
FIG. 5 is a portion of the circuit of FIG. 4 showing certain components in more detail and FIG. 6 is a signal diagram of selected signals of the circuit of FIG. 4.

In FIG. 5 is illustrated one example of an RC network incorporating an inverter 32. In this instance the inverter is a current mirror comprising a voltage source VA supplying voltage to a pair of P-MOS transistors 56 and an N-MOS transistor 57 supplying the voltage V to an N-MOS transistor 58 serving as a pull down to the inverter comprising the P-MOS and N-MOS transistor 59. Thus the current flow through the N-MOS transistor 58 is an exact duplicate of the current through the N-MOS transistor 57.

In the manner described, the NAND gate 40 either supplies a pulse of the duration T1 if the plate 12 is untouched, or of the duration T2 if the plate is touched (FIG. 6). Since the NAND gate has been enabled by the clocking pulse, the wave form 54 or 55 is transmitted through the NAND gate to the data terminal of the flip flop 18. At the clocking terminal is received a reference signal from the reference circuit comprising the inverter 38, the resistors 51E and 52D, the variable capacitance 56 and the NAND gate 46. By adjusting the variable capacitance, the time period of the pulse of the reference circuit is adjusted to equal the time period T3 of the waveform 57, which time period is approximately the average of the time periods T1 and T2, i.e., it appears in between these time periods. By making the time period T3 as near the midpoint between the other time periods as possible, the circuit is made more noise tolerant.

Figure 3:
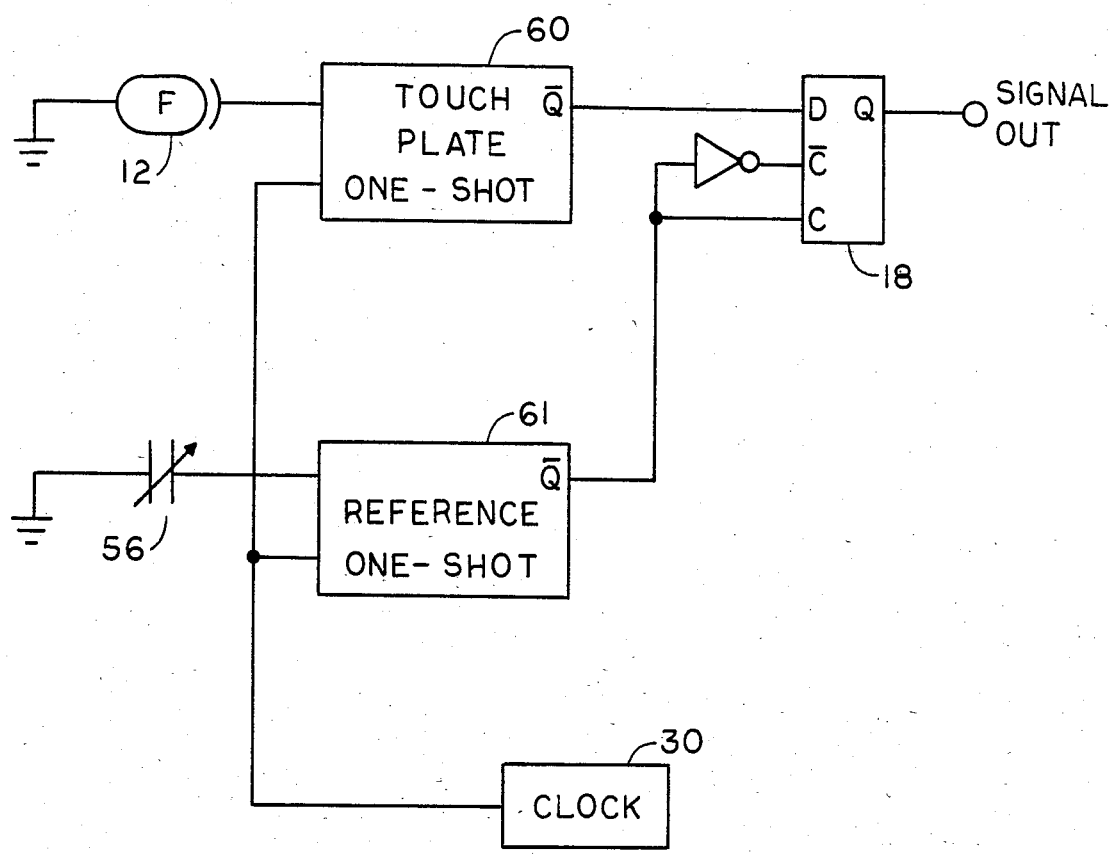
FIG. 3 is a block diagram circuit of one circuit incorporating the subject invention.

In FIG. 3 is shown a block diagram of a portion of the first embodiment of the invention. As shown therein, the touch plate 12 is connected to the external capacitance terminal of the one-shot 60. The reference capacitor 56 is connected to the external capacitance terminal of the one-shot 61. These capacitors can be changed to regulate the duration of the output signals of the respective one-shot circuits in the manner described relative to FIG. 4. However, herein is shown a representative circuit of only one touch plate and the reference circuit.

The output signals from the one-shot circuits are supplied to the input terminals to the flip flop 18 and the functioning is the same as previously described.

Thus it can be seen that the reference pulse is compared to the duration of the data pulse received from each NAND gate with the output signal from the associated flip flop at each terminal 24, 25, 26, 27 and 28 being a logical "0" indicating the associated plate is touched and with the output signals from the associated flip flops being a logical "1" when the associated plate is untouched. Thus there is provided a circuit for detecting the time period of each RC circuit associated with each of the touch plates. When the plate is touched, the time period is longer and when the plate is untouched, the time period is shorter. A logical "1" or a logical "0" is transmitted by each of the associated circuits indicating the touched or untouched condition of the plate.

I claim:

1. A switching mechanism for generating an output signal responsive to the touch of an operator, comprising:
   a clocking signal generator;
   a first circuit connected with said touch plate in a manner to effect a different time delay in the transmission of said clocking signal when said plate is touched and untouched;
   means for conducting said clocking signal to said first circuit;
   means for generating an output signal indicating the time delay effected on said clocking signal thereby to indicate whether the plate is touched or untouched;
   said first circuit including an RC circuit with the touch plate forming at least a portion of the capacitive component of the RC circuit;
   a NAND gate having first and second terminals with the first terminal connected to receive the output signal from said first circuit and the second terminal connected to receive said clocking signal with said means for generating an output signal receiving the output signal from said NAND gate;
   a flip flop circuit having first and second input terminals;
   means for transmitting the output signal from said NAND gate to said first terminal of said flip flop circuit;
   a second circuit including an RC circuit;
   means for transmitting the clocking signal to said second circuit; and
   means for transmitting the output signal from said second circuit to the second input terminal of said flip flop whereby the flip flop will generate an output signal responsive to the relative duration of said output signals received at the first and second flip flop input terminals to indicate whether the touch plate is touched.

2. A switching mechanism for generating an output signal responsive to the touch of an operator, comprising:
   a touch plate having a surface to be selectively touched by the operator;
   a clocking signal generator;
   a first one-shot connecting with said touch plate and connected to receive said clocking signal to generate an output signal having first and second time durations responsive to whether or not the touch plate is touched by the operator;
   a variable capacitor;
   a second one-shot connected to receive said clocking signal to generate an output signal having a time duration dependent on the capacitance of said variable capacitor;
   a flip flop having input terminals connected to receive the output signals from said first and second one-shots and generating an output signal responsive to which of the one-shot signals has the longest time duration.

* * * * *